United States Patent
Ko

(10) Patent No.: US 8,120,381 B2
(45) Date of Patent: Feb. 21, 2012

(54) IMPEDANCE ADJUSTING DEVICE

(75) Inventor: Hyeong-Jun Ko, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/833,241

(22) Filed: Jul. 9, 2010

(65) Prior Publication Data

US 2011/0291698 A1 Dec. 1, 2011

(30) Foreign Application Priority Data

May 31, 2010 (KR) .................. 10-2010-0051264

(51) Int. Cl.
*H03K 17/16* (2006.01)
*H03K 19/003* (2006.01)
(52) U.S. Cl. ................. 326/30; 326/27; 326/87
(58) Field of Classification Search .......... 326/26, 326/27, 30, 86, 87; 327/108, 109; 365/189.05, 365/189.07, 189.11, 202, 233.1, 198.51
See application file for complete search history.

(56) References Cited

U.S. PATENT DOCUMENTS

| 2005/0104620 A1* | 5/2005 | Ueno ...................... 326/30 |
| 2007/0010961 A1* | 1/2007 | Nguyen et al. ........... 702/107 |

FOREIGN PATENT DOCUMENTS

KR 1020090023833 3/2009

OTHER PUBLICATIONS

Notice of Preliminary Rejection issued from Korean Intellectual Property Office on May 31, 2011.

* cited by examiner

*Primary Examiner* — Shawki S Ismail
*Assistant Examiner* — Jany Tran
(74) *Attorney, Agent, or Firm* — IP & T Group LLP

(57) ABSTRACT

An impedance adjusting device includes a calibration unit configured to generate an impedance code for adjusting a termination impedance value, a plurality of termination units configured to be enabled by resistance selection information and terminate an interface node in response to the impedance code, a resistance providing unit coupled in parallel to the plurality of termination units and configured to provide a resistance in response to the resistance selection information, and a selection signal generation unit configured to generate the resistance selection information according to a target impedance value.

19 Claims, 6 Drawing Sheets

IMPEDANCE ADJUSTING DEVICE

CROSS-REFERENCE TO RELATED APPLICATIONS

The present application claims priority of Korean Patent Application No. 10-2010-0051264, filed on May 31, 2010, which is incorporated herein by reference in its entirety.

BACKGROUND OF THE INVENTION

Exemplary embodiments of the present invention relate to an impedance adjusting device which matches impedance of input/output pads for communication with external circuits by compensating for an increase in output impedance caused by power supply impedance in a semiconductor device.

A variety of semiconductor devices are implemented with integrated circuit chips, such as CPUs, memories, and gate arrays. Such semiconductor devices are incorporated into a variety of electrical products, such as personal computers, servers, and workstations. In most cases, semiconductor devices include reception circuits configured to receive a variety of external signals through input pads from external circuits, and output circuits configured to provide a variety of internal signals through output pads to external circuits.

Meanwhile, as the operating speeds of electrical products increase, swing widths of signals transmitted between semiconductor devices are gradually reduced in order to minimize delay time necessary for signal transfer. However, as the swing widths of the signals are reduced, the effects of external noises on the signals are increased, and therefore, signal reflection at interface terminals (i.e., input/output terminals) due to impedance mismatching becomes more severe. The impedance mismatching is generally caused by external noises or variations in power supply voltage, operating temperature, or fabrication process. The impedance mismatching may make it difficult to accurately transfer data at high speed and may distort output data outputted from data output terminals of the semiconductor device. Therefore, where the reception circuit of the semiconductor device receives the distorted output signals through the input terminals, setup/hold operations may fail or incorrect determinations of input levels may occur frequently.

In order to address the above concerns, semiconductor devices requiring high-speed operations have adopted impedance matching circuits, called on-die termination (ODT) devices, located in the vicinity of pads inside integrated circuit chips. In a typical ODT scheme, a source termination is performed at a transmission side by an output circuit, and a parallel termination is performed at a reception side by a termination circuit coupled in parallel to the reception circuit which is coupled to an input pad.

A ZQ calibration refers to a procedure of generating impedance codes which change according to variations of process, voltage, and temperature (PVT) conditions. A termination impedance value is adjusted using impedance codes generated from the ZQ calibration. Generally, a pad to which an external resistor, serving as a calibration reference impedance, is coupled is referred to as a ZQ pad. For this reason, the term "ZQ calibration" is widely used.

FIG. 1 is a block diagram of a conventional calibration circuit.

Referring to FIG. 1, the conventional calibration circuit includes a pull-up reference impedance unit 110, a dummy reference impedance unit 120, a pull-down reference impedance unit 130, comparison units 102 and 103, and counter units 104 and 105.

Upon operation of the conventional calibration circuit, the comparison unit 102 compares a reference voltage (generally, VDDQ/2) with a voltage of a first calibration node ZQ, which is the result of a voltage division between an external resistor 101 (hereinafter, assumed to be 240Ω) coupled to a ZQ pad and the pull-up reference impedance unit 110. The comparison unit 102 generates an up/down signal UP/DN as a result of the comparison.

The counter unit 104 generates a pull-up impedance code PCODE<0:N> in response to the up/down signal UP/DN outputted from the comparison unit 102. The pull-up impedance code PCODE<0:N> adjusts the impedance value of the pull-up reference impedance unit 110 by turning on/off parallel resistors inside the pull-up reference impedance unit 110 (the resistance values of the parallel resistors are designed according to binary weights). The adjusted impedance value of the pull-up reference impedance unit 110 again influences the voltage of the first calibration node ZQ, and the above-described operations are repeated. As a result, the calibration operation is repeated until the impedance value of the pull-up reference impedance unit 110 becomes equal to the impedance value of the external resistor 101. This operation is referred to as a pull-up calibration operation.

The pull-up impedance code PCODE<0:N> generated by the above-described pull-up calibration operation is inputted to the dummy reference impedance unit 120 and used to determine a total impedance value of the dummy reference impedance unit 120. Subsequently, a pull-down calibration operation is performed. In a similar manner to the pull-up calibration operation, the pull-down calibration operation is performed using the comparison unit 103 and the counter unit 105, so that a voltage of a second calibration node A becomes equal to the reference voltage VREF. Therefore, the total impedance value of the pull-down reference impedance unit 130 becomes equal to the impedance value of the dummy reference impedance unit 120. This operation is referred to as a pull-down calibration operation.

FIG. 2 is a block diagram of a conventional termination circuit.

The termination circuit refers to a circuit which receives the impedance codes PCODE<0:N> and NCODE<0:N) generated from the calibration circuit of FIG. 1 to terminate interface pads (e.g., input and output pads).

A pull-up termination unit 210 is designed to have a configuration similar to that of the pull-up reference impedance unit 110, and receives the pull-up impedance code PCODE<0:N>. Thus, the impedance value of the pull-up termination unit 210 tends to be similar to the impedance value of the pull-up reference impedance unit 110. That is, the impedance value of the pull-up termination unit 210 is the same as or proportional to the impedance value of the pull-up reference impedance unit 110. A pull-up termination enable signal PU_EN is a signal which turns on/off the pull-up termination unit 210. When the pull-up termination enable signal PU_EN is active, all resistors provided within the pull-up termination unit 210 are turned off (i.e., current does not flow through them). When the pull-up termination enable signal PU_EN is inactive, the resistors provided within the pull-up termination unit 210 are turned on or off according to the pull-up impedance code PCODE<0:N>.

A pull-down termination unit 220 is designed to have a configuration similar to that of the pull-down reference impedance unit 130, and receives the pull-down impedance code NCODE<0:N>. Thus, the impedance value of the pull-down termination unit 220 tends to be similar to the impedance value of the pull-down reference impedance unit 130. That is, the impedance value of the pull-down termination unit 220 is the same as or proportional to the impedance value of the pull-down reference impedance unit 130. A pull-down termination enable signal PD_EN is a signal which turns on/off the pull-down termination unit 220. When the pull-down termination enable signal PD_EN is inactive, all resistors provided within the pull-down termination unit 220 are turned off. When the pull-down termination enable signal PD_EN is active, the resistors provided within the pull-down termination unit 220 are turned on or off according to the pull-down impedance code NCODE<0:N>.

A pull-up voltage source resistor 201 symbolizes a total impedance value of a path coupled to an external voltage source which supplies a pull-up voltage, and a pull-down voltage source resistor 202 symbolizes a total impedance value of a path coupled to an external voltage source which supplies a pull-down voltage.

The above-described termination circuit may be a main driver of a data output driver which outputs data. When the pull-up termination enable signal PU_EN is inactive, the pull-up termination unit 210 sets the interface pad (e.g., a DQ pad) to a "high" voltage level. Thus, logic "high" data is outputted through the interface pad. When the pull-down termination enable signal PD_EN is active, the pull-down termination unit 220 sets the interface pad to a "low" voltage level. Thus, logic "low" data is outputted through the interface pad.

FIG. 3 is a block diagram of a conventional data output device.

Referring to FIG. 3, the data output device includes a calibration circuit 310, a termination circuit 320, and a selection signal generation unit 330. The calibration circuit 310 is the same as the circuit of FIG. 1, and the termination circuit 320 is the same as the circuit of FIG. 2.

In general, the pull-up and pull-down termination units 210 and 220 are laid out to have an impedance value of 240Ω each. However, a resistance of 120Ω is obtained by coupling the two termination units 210 and 220, each having the resistance of 240Ω, in parallel. Likewise, a resistance of 60Ω may be obtained by coupling four termination units 210 and 220, each having the resistance of 240Ω, in parallel. Therefore, the typical termination circuits having the resistances of 240Ω, 120Ω, and 60Ω includes seven total pull-up termination units 210 and pull-down termination units 220. As a larger number of the termination units 210 and 220 are driven, the influence of the voltage source resistors 201 and 202, described above with reference to FIG. 2, increases. Consequently, a mismatch occurs between a target impedance value and an actual impedance value, which is described in more detail below.

The selection signal generation unit 330 generates resistance selection information RES_CHO<0:A> which determines how many units of the seven termination units 210 and 220 are driven according to the target impedance value. In the DDR3 DRAM, one, two, and four termination units may be driven at a particular time to generate target impedances of 240 Ω, 120Ω, and 60Ω, respectively. There are two causes that increase the occurrence of a mismatch as the number of the driven termination units 210 and 220 increases.

First, as the target impedance value is lowered, the number of the driven termination units 210 and 220 increases. Since the magnitude of the power supply voltage VDDQ is constant and the target impedance value becomes lower, a current flowing through the voltage source resistors 201 and 202 increases. Since the impedance values of the voltage source resistors 201 and 202 are constant and the magnitude of the current flowing through the voltage source resistors 201 and 202 increases, the voltage drop caused by the voltage source resistors 201 and 202 increases. Accordingly, the drain-source voltages of a PMOS transistor and an NMOS transistor incorporated in the termination units 210 and 220 are lowered. Moreover, the drain-source voltage and the drain-source current of the PMOS and NMOS transistors are varied so that impedance values of the respective transistors increase. Hence, the total impedance value increases, causing a mismatch between the target impedance value and the actual impedance value.

Second, a mismatch occurs because the impedance values of the voltage source resistors 201 and 202 are constant, regardless of the number of the driven termination units 210 and 220. That is, when assuming that the number of the driven termination units 210 and 220 is N (where N is an integer and defined by 1≦N≦7), the total impedance value of the driven termination units 210 and 220 becomes 1/N due to the parallel connection because the impedance values of the voltage source resistors 201 and 202 do not change.

For example, it is assumed that the impedance values of the voltage source resistors 201 and 202 are 1Ω. Thus, where seven termination units 210 and 220 are all driven and each have an impedance of 240Ω, the original target impedance value is 34.29Ω (=240/7). The impedance values of the termination units 210 and 220 are determined by the impedance codes PCODE<0:N> and NCODE<0:N> generated from the reference impedance units 110, 120, and 130. Since the layouts of the reference impedance units 110, 120, and 130 are the same as those of the termination units 210 and 220, resistors similar to the voltage source resistors 201 and 202 exist in the reference impedance units 110, 120 and 130. Accordingly, the impedance codes PCODE<0:N> and NCODE<0:N> have code values which cause the respective termination units 210 and 220 to have impedance values of 239Ω. In this case, since the impedance values of the seven termination units 210 and 220 become 239Ω, the total impedance value becomes 35.14Ω (=239/7+1). Consequently, the actual impedance value becomes larger than the target value.

The difference between the resistance selection information RES_CHO<0:A> and the impedance codes PCODE<0:N> and NCODE<0:N> is as follows. The single termination units 210 and 220 each have an impedance value of 240Ω when the internal parallel resistors are all in an "on" state (i.e., the "on" state refers to when current flows through the resistor). Thus, the termination impedance value has the target impedance value. For example, the termination impedance value has the target impedance value of 120 Ω, 60Ω, and so on. When the target impedance value is 120Ω, two termination units 210 and 220 are enabled. When the target impedance value is 60Ω, four termination units 210 and 220 are enabled. The resistance selection information RES_CHO<0:N> is used to select the termination units 210 and 220 which should ideally be enabled to obtain the target impedance value.

On the other hand, the impedance codes PCODE<0:N> and NCODE<0:N> are generated in order to finely adjust the impedance value after the termination units 210 and 220 are enabled by the target impedance value. Even though an appropriate number of the termination units 210 and 220 are selected according to the target impedance value, the actual impedance value of the termination units 210 and 220 is changed according to the variation in the PVT conditions. That is, a mismatch occurs between the actual impedance value and the target impedance value. Since the performance of the termination circuit is greatly influenced by even a small change of the impedance value, it may be necessary to finely adjust the termination impedance value. To this end, a plurality of parallel resistors provided in the termination units 210 and 220 are turned on/off by the impedance codes PCODE<0:N> and NCODE<0:N> so that the termination impedance value coincides with the target impedance value even though the PVT conditions are varied. Through such procedures, the impedance values of the termination units 210 and 220 are finely adjusted.

That is, as a number of the termination units 210 and 220 that are driven increases, the actual impedance value of the termination units 210 and 220 becomes larger than the target impedance value.

SUMMARY OF THE INVENTION

Exemplary embodiments of the present invention are directed to an impedance adjusting device which is capable of obtaining a desired termination impedance, without increasing the number of bits of an impedance code.

In accordance with an exemplary embodiment of the present invention, an impedance adjusting device includes a calibration unit configured to generate an impedance code for adjusting a termination impedance value, a plurality of termination units configured to be enabled by resistance selection information and terminate an interface node in response to the impedance code, a resistance providing unit coupled in parallel to the plurality of termination units and configured to provide a resistance in response to the resistance selection information, and a selection signal generation unit configured to generate the resistance selection information according to a target impedance value.

The resistance providing unit may include a resistor, and a switching unit coupled in series with the resistor and configured to be turned on/off in response to the resistance selection information.

In accordance with another exemplary embodiment of the present invention, an impedance adjusting device includes a calibration unit configured to generate a pull-up code for adjusting a pull-up termination impedance value, and a pull-down code for adjusting a pull-down termination impedance value, a plurality of pull-up termination units configured to be enabled by resistance selection information and pull-up terminate an interface node in response to the pull-up code, a plurality of pull-down termination units configured to be enabled by the resistance selection information and pull-down terminate the interface node in response to the pull-down code, a first resistance providing unit coupled in parallel to the plurality of pull-up termination units and configured to provide a resistance in response to the resistance selection information, and a selection signal generation unit configured to generate the resistance selection information according to a target impedance value.

The first resistance providing unit may include a pull-up resistor, and a switching unit coupled in series with the pull-up resistor and configured to be turned on/off in response to the resistance selection information.

The impedance adjusting device may further include a second resistance providing unit coupled in parallel to the plurality of pull-down termination units and configured to provide a resistance in response to the resistance selection information.

The second resistance providing unit may include a pull-down resistor, and a switching unit coupled in series with the pull-down resistor and configured to be turned on/off in response to the resistance selection information.

In accordance with yet another exemplary embodiment of the present invention, an impedance adjusting device includes a calibration unit configured to generate an impedance code for adjusting a termination impedance value, a termination unit configured to be enabled by resistance selection information and terminate an interface node in response to the impedance code, and a resistance providing unit coupled in parallel to the termination unit and configured to provide a resistance in response to the resistance selection information and not in response to the impedance code.

The resistance providing unit may include a resistor, an AND gate configured to perform an AND operation on an enable signal and a portion of the resistance selection information, and a MOS transistor coupled between the resistor and the termination unit and configured to turn on/off in response to an output of the AND gate.

DESCRIPTION OF SPECIFIC EMBODIMENTS

Figure 1:
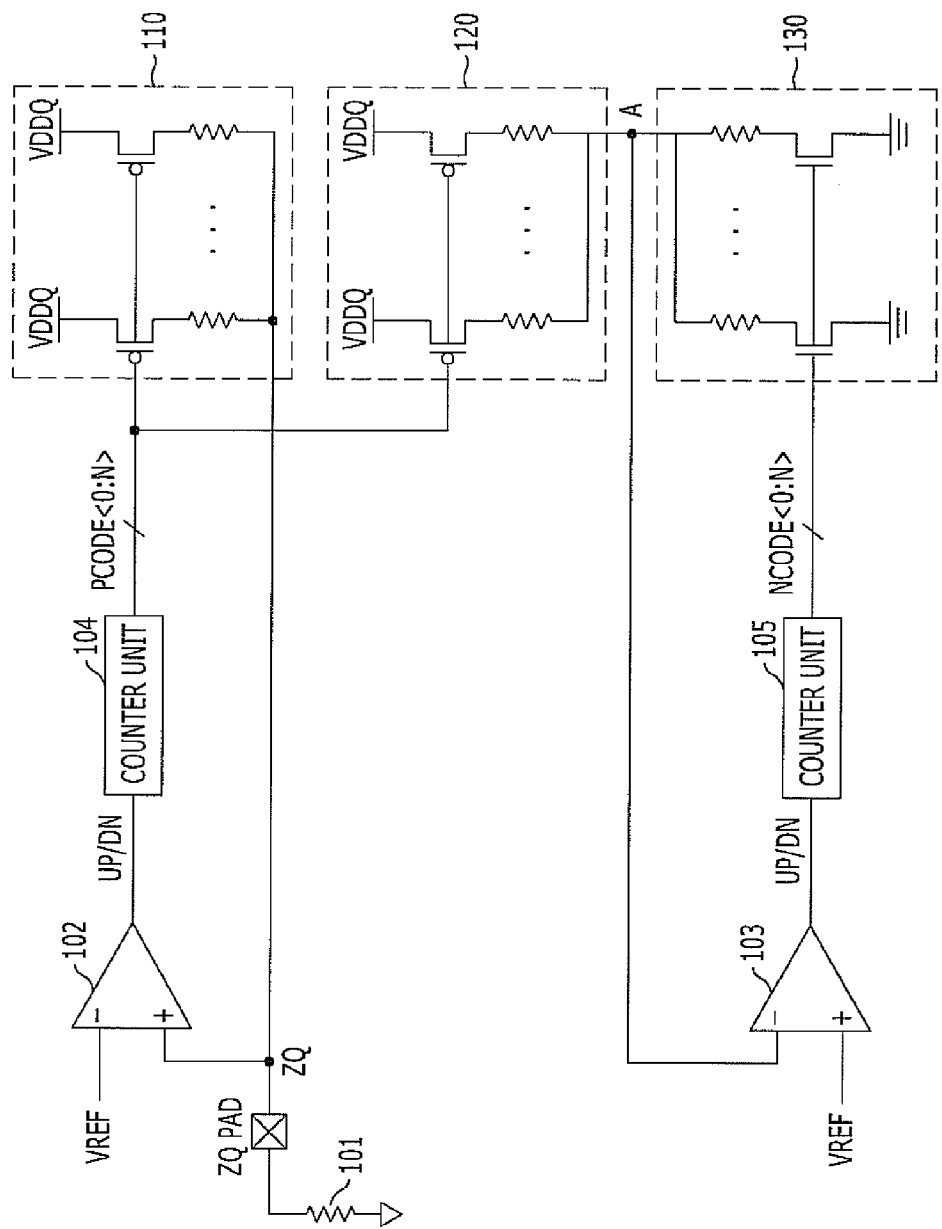
FIG. 1 is a block diagram of a conventional calibration circuit.
Figure 2:
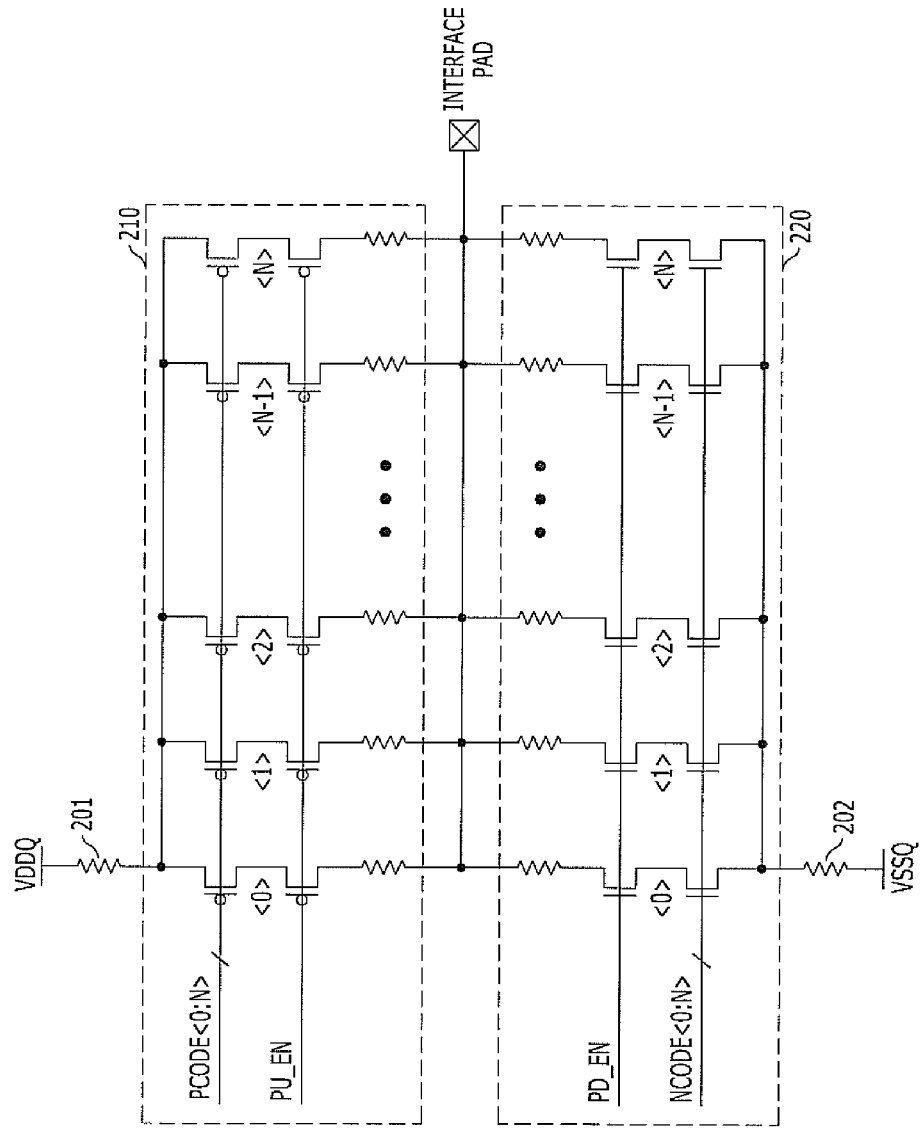
FIG. 2 is a block diagram of a conventional termination circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Hereinafter, an impedance adjusting device refers to a device which includes a calibration circuit and a termination circuit. In addition, since a transistor has a resistance component, resistors which are turned on/off according to signals may be shown with only PMOS/NMOS transistors which are turned on/off according to a gate input voltage.

Figure 4:
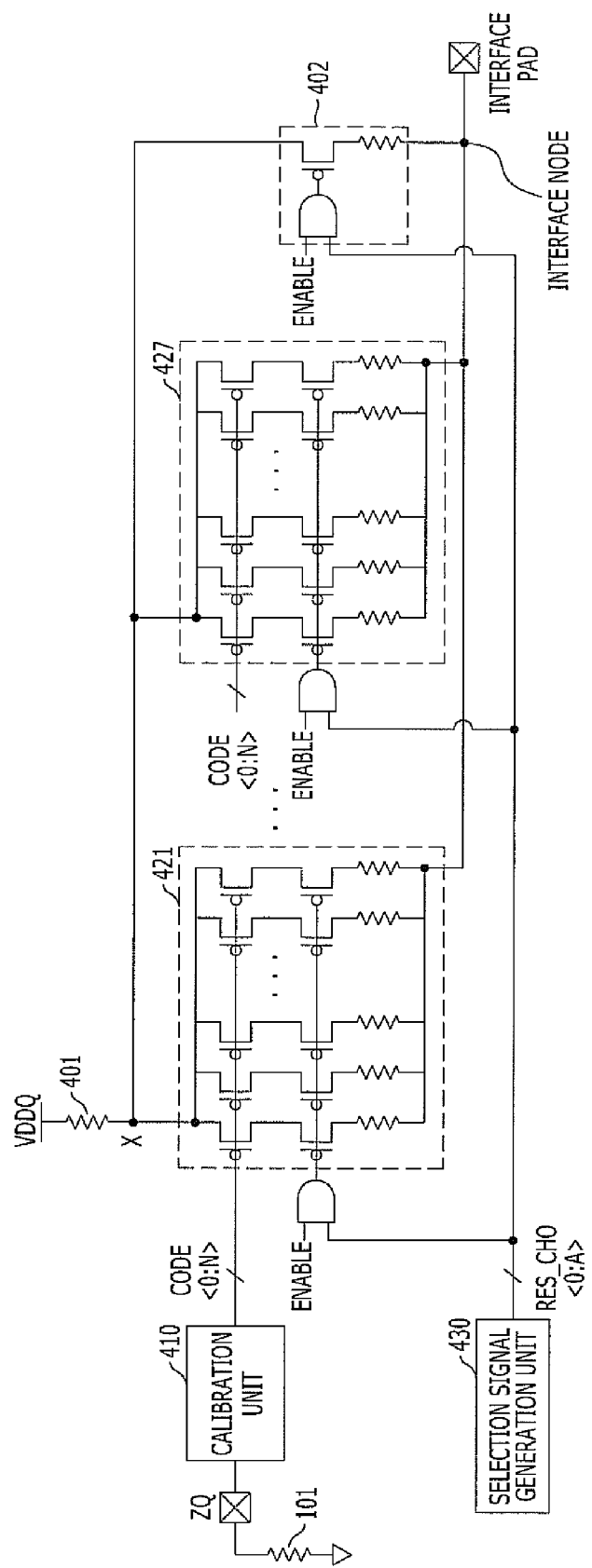
FIG. 4 is a block diagram of an impedance adjusting device in accordance with an exemplary embodiment of the present invention.

FIG. 4 is a block diagram of an impedance adjusting device in accordance with an exemplary embodiment of the present invention.

Referring to FIG. 4, an impedance adjusting device in accordance with an exemplary embodiment of the present invention includes a calibration unit 410, a plurality of termination units 421 to 427 (although FIG. 4 does not show termination units 422 to 426), a resistance providing unit 402, and a selection signal generation unit 430. The calibration unit 410 is configured to generate an impedance code CODE<0:N> for adjusting a termination impedance value. Herein, the impedance code CODE<0:N> includes N different signals CODE<0> to CODE<N>, where N is any positive integer. The plurality of termination units 421 to 427 are configured to be enabled by resistance selection information RES_CH0<0:A> and terminate an interface node (interface pad) by using a plurality of parallel resistors which are turned on/off in response to the impedance code CODE<0:N>.

Herein, the resistance selection information RES_CHO<0:A> includes A different signals RES_CHO<0> to RES_CHO<A>, where A is any positive integer. The resistance providing unit 402 is coupled in parallel to the plurality of termination units 421 to 427 and configured to provide a resistance in response to the resistance selection information RES_CHO<0:A>. The resistance providing unit 402 includes a resistor and a switching unit. The resistor is coupled in parallel to the plurality of termination units 421 to 427. The switching unit may include an AND gate and a PMOS transistor. The switching unit is coupled in series with the resistor and is configured to be turned on/off in response to the resistance selection information RES_CHO<0:A>. The selection signal generation unit 430 is configured to generate the resistance selection information RES_CHO<0:A> according to a target impedance value.

Hereinafter, it is assumed that only one resistance providing unit 402 is turned on/off in response to the resistance selection information RES_CHO<0:A>. However, it is apparent that two or more resistance providing units 402 (not shown in FIG. 4) may be turned on/off in response to the resistance selection information RES_CHO<0:A>. Where there is a plurality of resistance providing units 402, the plurality of resistance providing units 402 are controlled such that some of them are turned on and the others are turned off according to the code value of the resistance selection information RES_CHO<0:A>.

A voltage source resistor 401 is coupled between a power supply terminal (e.g., a power supply terminal supplying a power supply voltage VDDQ) and a node X, which is a common node of the plurality of termination units 421 to 427 that are coupled in parallel.

The resistance providing unit 402 decreases a termination impedance value when the target impedance value is less than a certain impedance value (for example, a set impedance of 60Ω), and has no influence on the termination impedance value when the target impedance value is greater than the certain impedance value (for example, the set impedance of 60Ω).

The resistance providing unit 402 is coupled in parallel with the plurality of termination units 421 to 427 between the node X and an interface node, which is a data pad (e.g., the interface pad shown in FIG. 4) through which data is inputted/outputted.

Since the calibration operation of the calibration unit 410 is substantially identical to that described with reference to FIG. 1, a detailed description thereof is omitted.

The termination operation of the plurality of termination units 421 to 427 is as follows. The termination enable signal ENABLE is a signal which turns on/off the plurality of termination units 421 to 427. The resistance selection information RES_CHO<0:A> is a signal which turns on some units selected among the plurality of termination units 421 to 427. When the termination enable signal ENABLE is inactive, the transistors provided inside the plurality of termination units 421 to 427 are turned on. When the termination enable signal ENABLE is active, the transistors provided inside the plurality of termination units 421 to 427 are turned on/off according to the resistance selection information RES_CHO<0:A>. That is, when the termination enable signal ENABLE is active, only the transistors provided inside the termination units 421 to 427 that are selected by the resistance selection information RES_CHO<0:N> are turned on.

Figure 3:
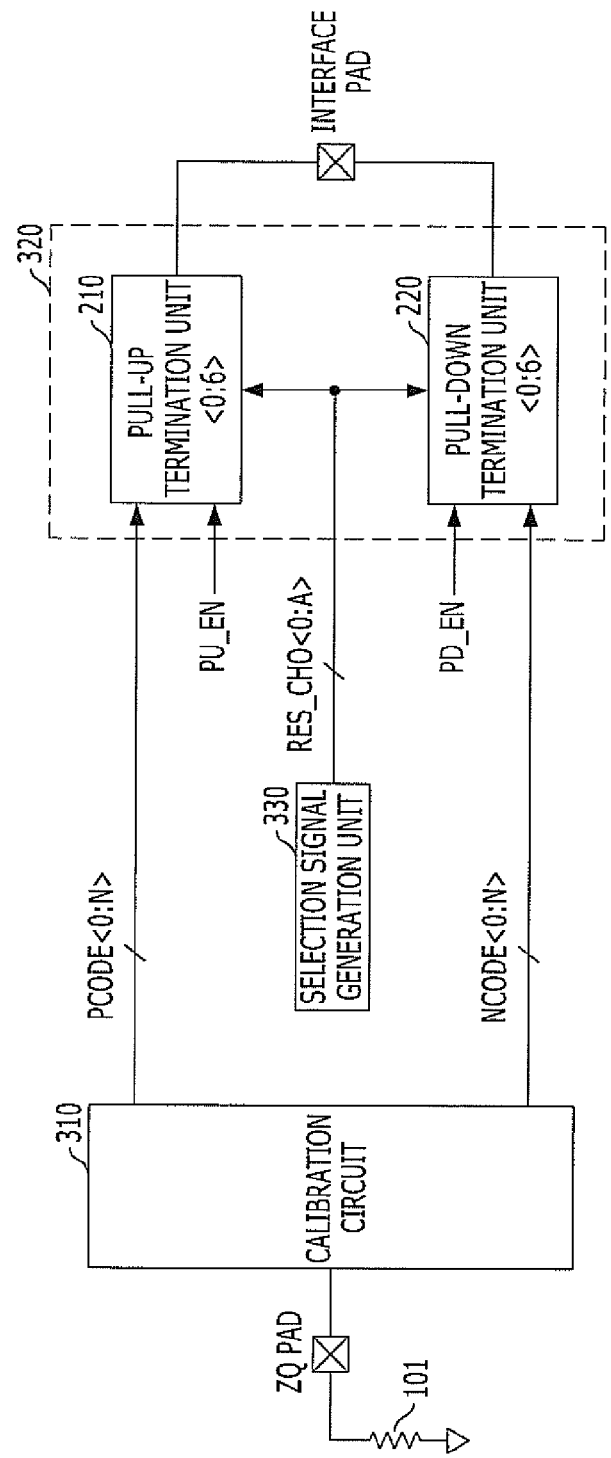
FIG. 3 is a block diagram of a conventional data output device.

The relationship between the resistance selection information RES_CHO<0:A> and the impedance code CODE<0:N> is identical to that described above with reference to FIG. 3.

It is assumed below that the plurality of termination units 421 to 427 are, for example, seven pull-up termination units 421 to 427. Furthermore, it is assumed that the pull-up termination unit 421 corresponds to a 240-Ω resistor, the two pull-up termination units 422 and 423 together correspond to a 120-Ω resistor, and the four pull-up termination units 424, 425, 426, and 427 together correspond to a 60-Ω resistor.

Also, it is assumed that the resistance providing unit 402 is turned "on" by the resistance selection information RES_CHO<0:A> when the target impedance value is less than 60Ω, and the resistance providing unit 402 is turned "off" by the resistance selection information RES_CHO<0:A> when the target impedance value is greater than 60 Ω.

The operation of the impedance adjusting circuit in accordance with an exemplary embodiment of the present invention is described below. When the target impedance value is greater than 60Ω, some of the termination units 421, 422 and 423 (i.e., the plurality of the termination units 421 to 427, except for the pull-up termination units 424, 425, 426 and 427 which together correspond to the 60-Ω resistor) among the pull-up termination units 421 to 427 are turned "on" by the resistance selection information RES_CHO<0:A>, and the others are turned "off". Since the termination operation is identical to that described above, a detailed description thereof will be omitted.

In this case, since the target impedance value is greater than 60Ω, the resistance providing unit 402 is turned "off" by the resistance selection information RES_CHO<0:A>. Therefore, the termination impedance value which pull-up terminates the interface pad is equal to the impedance value given by the turned-on termination units coupled in parallel among the plurality of pull-up termination units 421 to 427. That is, the resistance providing unit 402 has no influence on the termination impedance value.

When the target impedance value is less than or equal to 60Ω, some of the pull-up termination units 421 to 427 are turned "on" by the resistance selection information RES_CHO<0:A>, and the others are turned "off". For example, when the target impedance value is 60Ω, the pull-up termination units 424, 425, 426 and 427 corresponding to the 60-Ω resistor are turned "on", and the others are turned "off".

In this case, since the pull-up termination impedance value is reduced, the actual pull-up termination impedance value is increased greater than the target impedance value by the voltage source resistor 401. Since the cause of this problem has been already described in the background of the invention, a detailed description thereof will be omitted. Therefore, the resistance providing unit 402 coupled in parallel to the pull-up termination units 421 to 427 is turned "on" by the resistance selection information RES_CHO<0:A>, and the pull-up termination impedance value is decreased.

The target impedance value is changed according to the following situations. For example, when the semiconductor memory device performs a data output operation, the termination units 421 to 427 operate as an output driver. At this time, the target impedance value is 34Ω, and all of the seven termination units 421 to 427 are turned "on". When the semiconductor memory device performs a data input operation, the target impedance value may be 240 Ω, 120 Ω, 80 Ω, 60Ω or 40Ω in order to match the impedance of an external device. Moreover, where the target impedance is 240 Ω, 120 Ω, 80 Ω, 60Ω, or 40Ω, one, two, three, four, or six of the seven termination units 421 to 427 are turned "on," respectively. For example, in a DDR3 semiconductor memory device, the target impedance value is set according to a mode register set (MRS) setting value. The selection signal generation unit 430 controls the termination units 421 to 427 by generating the resistance selection signal RES_CHO<0:A> containing information which turns "on" an appropriate number of termination units 421 to 427 according to the operation of the semiconductor memory device.

Although a case in which the termination units 421 to 427 are the pull-up termination units has been described above, it is apparent that the invention can also be applied to a case in which the termination units 421 to 427 are pull-down termination units which pull-down terminate the interface node.

Figure 5:
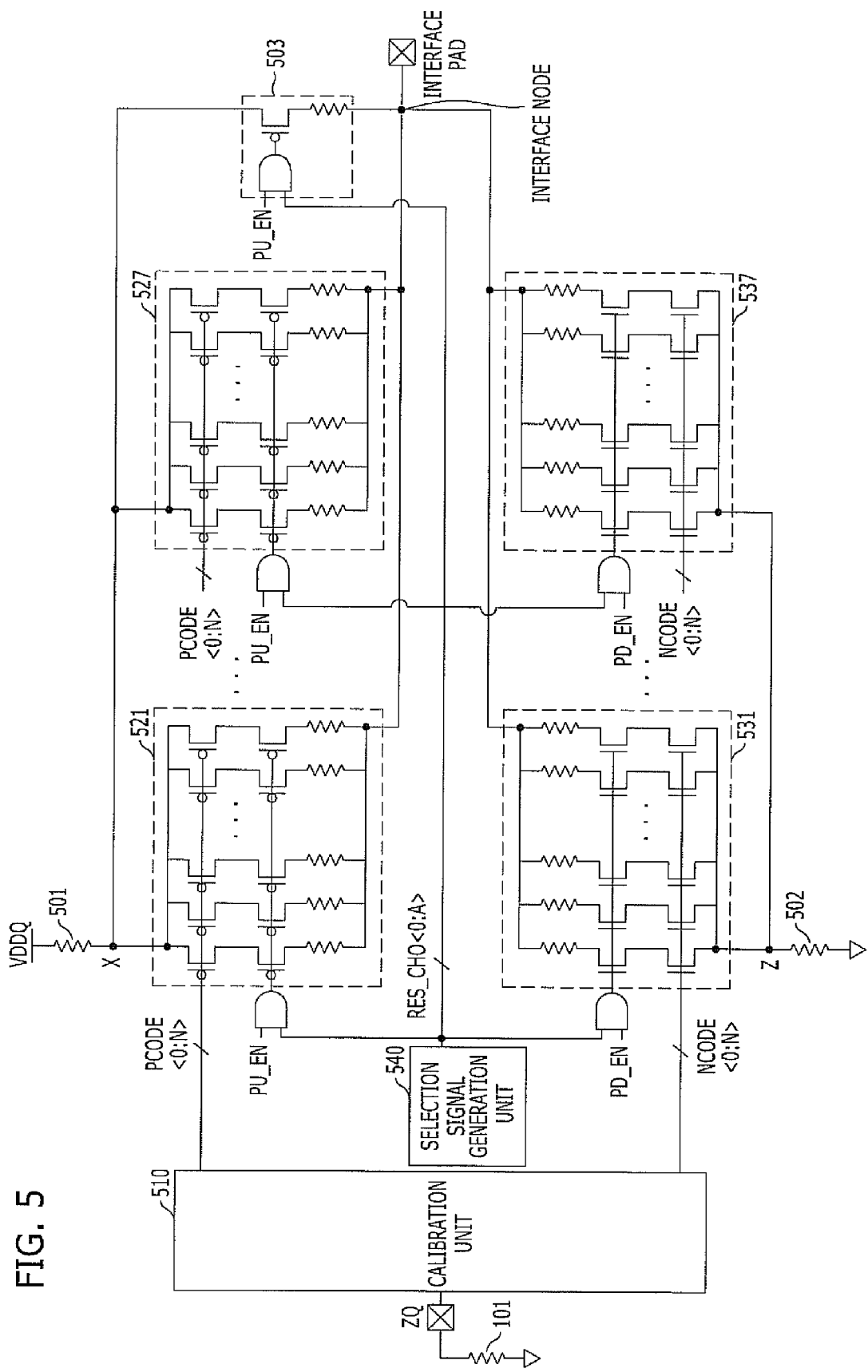
FIG. 5 is a block diagram of an impedance adjusting device in accordance with another exemplary embodiment of the present invention.

FIG. 5 is a configuration diagram of an impedance adjusting device in accordance with another exemplary embodiment of the present invention.

Referring to FIG. 5, an impedance adjusting device in accordance with another exemplary embodiment of the present invention includes a calibration unit 510, a plurality of pull-up termination units 521 to 527, a plurality of pull-down termination units 531 to 537, a resistance providing unit 503, and a selection signal generation unit 540. The calibration unit 510 is configured to generate a pull-up code PCODE<0:N> for adjusting a pull-up termination impedance value, and a pull-down code NCODE<0:N> for adjusting a pull-down termination impedance value. The plurality of pull-up termination units 521 to 527 are configured to be enabled by resistance selection information RES_CHO<0:A> and pull-up terminate an interface node. The plurality of pull-down termination units 531 to 537 are configured to be enabled by the resistance selection information RES_CHO<0:A> and pull-down terminate an interface node. The resistance providing unit 503 is coupled in parallel to the plurality of pull-up termination units 521 to 527 and configured to provide a resistance in response to the resistance selection information RES_CHO<0:A>. The resistance providing unit 503 includes a resistor and a switching unit. The resistor is coupled in parallel to the plurality of pull-up termination units 521 to 527. The switching unit may include an AND gate and a PMOS transistor. The switching unit is coupled in series with the resistor and is configured to be turned on/off in response to the resistance selection information RES_CHO<0:A>. The selection signal generation unit 540 is configured to generate the resistance selection information RES_CHO<0:A> according to a target impedance value.

Hereinafter, it is assumed that only one resistance providing unit 503 is turned on/off in response to the resistance selection information RES_CHO<0:A>. However, it is apparent that two or more resistance providing units 503 (not shown in FIG. 5) may be turned on/off in response to the resistance selection information RES_CHO<0:A>. Where there is a plurality of resistance providing units 503, the plurality of resistance providing units 503 are controlled such that some of them are turned on and the others are turned off according to the code value of the resistance selection information RES_CHO<0:A>.

A pull-up voltage source resistor 501 is coupled between a power supply terminal (e.g., a power supply terminal supplying a power supply voltage VDDQ) and a node X, which is a common node of the plurality of pull-up termination units 521 to 527 that are coupled in parallel. A pull-down voltage source resistor 502 is coupled between a ground terminal (e.g., a ground terminal for supplying a ground voltage) and a node Z, which is a common node of the plurality of pull-down termination units 531 to 537 that are coupled in parallel.

The resistance providing unit 503 decreases a pull-up termination impedance value when the target impedance value is less than a certain impedance value (for example, a set impedance of 60Ω), and has no influence on the termination impedance value when the target impedance value is greater than the certain impedance value (for example, the set impedance of 60Ω).

The resistance providing unit 503 is coupled in parallel with the plurality of pull-up termination units 521 to 527 between the node Z and an interface node, which is coupled to a data pad (e.g., an interface pad) through which data is inputted/outputted.

Since the calibration operation of the calibration unit 510 is substantially identical to that described with reference to FIG. 1, a detailed description thereof is omitted.

The termination operation of the plurality of pull-up termination units 521 to 527 is as follows. The pull-up termination enable signal PU_EN is a signal which turns on/off the plurality of pull-up termination units 521 to 527. The resistance selection information RES_CHO<0:A> is a signal which turns on some units selected among the plurality of pull-up termination units 521 to 527. When the pull-up termination enable signal PU_EN is inactive, the transistors provided inside the plurality of pull-up termination units 521 to 527 are turned on. When the pull-up termination enable signal PU_EN is active, the transistors provided inside the plurality of pull-up termination units 521 to 527 are turned on/off according to the resistance selection information RES_CHO<0:A>.

It is assumed below that the number of the pull-up termination units 521 to 527 is 7 and the number of the pull-down termination units 531 to 537 is 7. In this exemplary embodiment, it is also assumed that the pull-up termination unit 521 and pull-down termination unit 531 together correspond to a 240-Ω resistor, the two pull-up termination units 522 and 523 and the two pull-down termination units 532 and 533 together correspond to a 120-Ω resistor, and the four pull-up termination units 524, 525, 526 and 527 and the four pull-down termination units 534, 535, 536 and 537 together correspond to a 60-Ω resistor.

Also, it is assumed that the resistance providing unit 503 is turned "on" by the resistance selection information RES_CHO<0:A> when the target impedance value is less than 60Ω, and the resistance providing unit 503 is turned "off" by the resistance selection information RES_CHO<0:A> when the target impedance value is greater than 60 Ω.

The operation of the impedance adjusting circuit in accordance with an exemplary embodiment of the present invention is described below. When the target impedance value is greater than 60Ω, some of the pull-up termination units 521, 522, and 523 and some of the pull-down termination units 531, 532, and 533 (i.e., all of the plurality of pull-up and pull-down transistors but those corresponding to the 60-Ω resistor) are turned "on" by the resistance selection information RES_CHO<0:A>, and the others are turned "off". Since the termination operation is identical to that described above, a detailed description thereof will be omitted.

In this case, since the target impedance value is greater than 60Ω, the resistance providing unit 503 is turned "off" by the resistance selection information RES_CHO<0:A>. That is, the resistance providing unit 503 has no influence on the pull-up termination impedance value.

Therefore, the pull-up termination impedance value which pull-up terminates the interface node is equal to the impedance value given by the turned-on pull-up termination units coupled in parallel among the plurality of pull-up termination units 521 to 527. Also, the pull-down termination impedance value which pull-down terminates the interface node is equal to the impedance value given by the turned-on pull-down termination units coupled in parallel among the plurality of pull-down termination units 531 to 537.

When the target impedance value is less than or equal to 60Ω, some of the pull-up termination units 521 to 527 and some of the pull-down termination units 531 to 537 are turned "on" by the resistance selection information RES_CH0<0:A>, and the others are turned "off".

For example, when the target impedance value is 60Ω, the pull-up termination units 524, 525, 526 and 527 and the pull-down termination units 534, 535, 536 and 537 corresponding to the 60-Ω resistor are turned "on", and the others are turned "off".

In this case, since the pull-up/pull-down termination impedance values are reduced, the actual pull-up/pull-down termination impedance values are increased greater than the target impedance value by the pull-up/pull-down voltage source resistors 501 and 502. Since the cause of this problem has been already described in the background of the invention, a detailed description thereof will be omitted. Therefore, the resistance providing unit 503 coupled in parallel to the pull-up termination units 521 to 527 is turned "on" by the resistance selection information RES_CH0<0:A>, and the pull-up termination impedance value is decreased.

Since the degree of increase in the impedance value by the voltage source resistors 501 and 502 is greater in the PMOS transistor than in the NMOS transistor, the resistance providing unit 503 is coupled in parallel to the pull-up termination units 521 and 527 and not the pull-down termination units 531 to 537, as described with reference to FIG. 5.

In some cases, however, it is apparent that one or more resistance providing units 503 turned on/off by the resistance selection information RES_CH0<0:A> may be coupled in parallel to the pull-down termination units 531 to 537.

Figure 6:
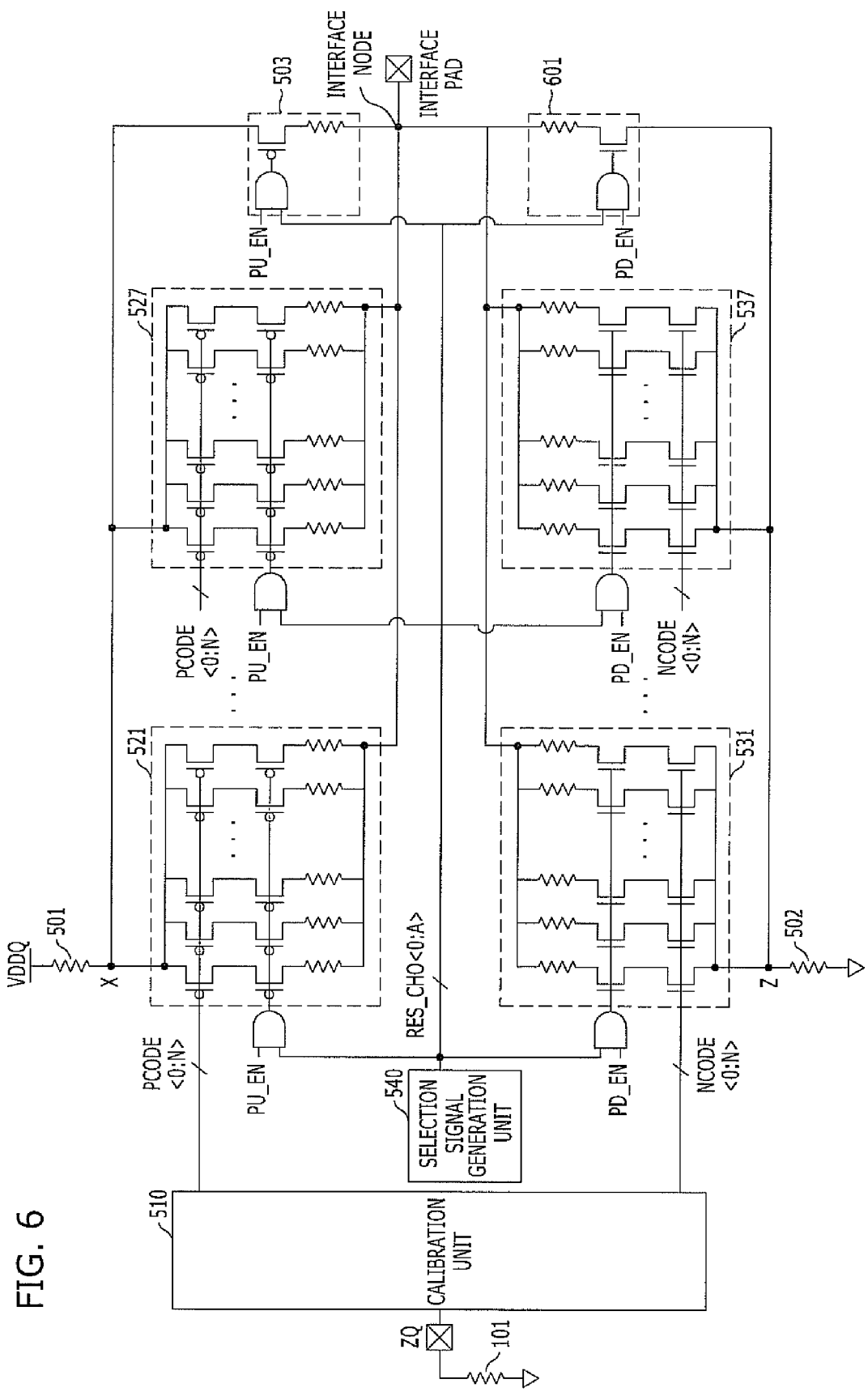
FIG. 6 is a block diagram of an impedance adjusting device in accordance with yet another exemplary embodiment of the present invention.

FIG. 6 is a block diagram of an impedance adjusting device in accordance with yet another exemplary embodiment of the present invention.

Referring to FIG. 6, an impedance adjusting device in accordance with yet another exemplary embodiment of the present invention includes the calibration unit 510, the plurality of pull-up termination units 521 to 527, the plurality of pull-down termination units 531 to 537, the resistance providing unit 503, and the selection signal generation unit 540 of FIG. 5. However, the exemplary embodiment of FIG. 6, further includes a second resistance providing unit 601, which is coupled in parallel to the plurality of pull-down termination units 531 to 537 and turned on/off in response to the resistance selection information RES_CH0<0:A>. The second resistance providing unit 601 includes a resistor and a switching unit. The resistor is coupled in parallel to the plurality of pull-down termination units 531 to 537. The switching unit may include an AND gate and a NMOS transistor. The switching unit is coupled between the resistor and the node Z and is configured to be turned on/off in response to the resistance selection information RES_CH0<0:A>.

Hereinafter, it is assumed that only one resistance providing unit 503 and only one second resistance providing unit 601 is turned on/off in response to the resistance selection information RES_CH0<0:A>. However, it is apparent that two or more resistance providing units 503 and two or more second resistance providing units 601 may be provided. Where there is a plurality of resistance providing units 503 and/or a plurality of second resistance providing units 601, the plurality of resistance providing units 503 and the plurality of second resistance providing units 601 are controlled such that some of them are turned on and the others are turned off according to the code value of the resistance selection information RES_CH0<0:A>.

When the target impedance value is less than a certain impedance value, the resistance providing unit 503 and the second resistance providing unit 601 reduce the pull-up termination impedance value and the pull-down termination impedance value. When the target impedance value is greater than the certain impedance value, the resistance providing unit 503 and the second resistance providing unit 601 have no influence on the pull-up termination impedance value and the pull-down termination impedance value.

Since the calibration operation, the termination operation, and the operation of the resistance providing unit 503 are substantially identical to those of FIG. 5, a detailed description thereof will be omitted. Also, since the operations of the second resistance providing unit 601 are substantially identical to that of the resistance providing unit 503, a detailed description thereof will be omitted.

The impedance adjusting devices in accordance with the exemplary embodiments of the present invention generate the resistance selection information according to the target impedance value and finely adjust the impedance value of the termination units. Therefore, the accuracy of the termination operation may be improved without increasing the number of bits of the impedance code.

While the present invention has been described with respect to the specific embodiments, it will be apparent to those skilled in the art that various changes and modifications may be made without departing from the spirit and scope of the invention as defined in the following claims.

What is claimed is:

1. An impedance adjusting device comprising:
   a calibration unit configured to generate an impedance code for adjusting a termination impedance value;
   a selection signal generation unit configured to generate resistance selection information according to a target impedance value:
   a plurality of termination units, each configured to be selectively enabled by the resistance selection information and terminate an interface node in response to the impedance code; and
   a resistance providing unit coupled in parallel to the plurality of termination units and configured to provide a resistance in response to the resistance selection information,
   wherein the resistance providing unit is structurally different from each of the termination units and is configured to be enabled in response to a comparison of the target impedance value to a reference impedance value.

2. The impedance adjusting device of claim 1, wherein the plurality of termination units are coupled in series with a voltage source resistor at a node to which the plurality of termination units are coupled in parallel.

3. The impedance adjusting device of claim 1, wherein the resistance providing unit comprises:
   a resistor; and
   a switching unit coupled in series with the resistor and configured to be turned on/off in response to the resistance selection information.

4. The impedance adjusting device of claim 3, wherein the resistance providing unit reduces the termination impedance value when the target impedance value is less than a certain value, and has no influence on the termination impedance value when the target impedance value is greater than the certain value.

5. The impedance adjusting device of claim 1, wherein the interface node is a node coupled to a data pad through which data is inputted/outputted.

6. An impedance adjusting device comprising:
- a calibration unit configured to generate a pull-up code for adjusting a pull-up termination impedance value, and a pull-down code for adjusting a pull-down termination impedance value;
- a selection signal generation unit configured to generate resistance selection information according to a target impedance value;
- a plurality of pull-up termination units, each configured to be selectively enabled by the resistance selection information and pull-up terminate an interface node in response to the pull-up code;
- a plurality of pull-down termination units, each configured to be selectively enabled by the resistance selection information and pull-down terminate the interface node in response to the pull-down code; and
- a first resistance providing unit coupled in parallel to the plurality of pull-up termination units and configured to provide a resistance in response to the resistance selection information, and
- wherein the first resistance providing unit is structurally different from each of the pull-up termination units and is configured to be enabled in response to a comparison of the target impedance value to a reference impedance value.

7. The impedance adjusting device of claim 6, wherein the plurality of pull-up termination units are coupled in series with a pull-up voltage source resistor at a first node to which the plurality of pull-up termination units are coupled in parallel, and the plurality of pull-down termination units are coupled in series with a pull-down voltage source resistor at a second node to which the plurality of pull-down termination units are coupled in parallel.

8. The impedance adjusting device of claim 6, wherein the first resistance providing unit comprises:
- a pull-up resistor; and
- a switching unit coupled in series with the pull-up resistor and configured to be turned on/off in response to the resistance selection information.

9. The impedance adjusting device of claim 8, wherein the first resistance providing unit reduces the pull-up termination impedance value when the target impedance value is less than a certain value, and has no influence on the termination impedance value when the target impedance value is greater than the certain value.

10. The impedance adjusting device of claim 8, further comprising a second resistance providing unit coupled in parallel to the plurality of pull-down termination units and configured to provide a resistance in response to the resistance selection information,
- wherein the second resistance providing unit is structurally different from each of the pull-down termination units and is configured to be enabled in response to the comparison of the target impedance value to the reference impedance value.

11. The impedance adjusting device of claim 10, wherein the second resistance providing unit comprises:
- a pull-down resistor; and
- a switching unit coupled in series with the pull-down resistor and configured to be turned on/off in response to the resistance selection information.

12. The impedance adjusting device of claim 11, wherein the first resistance providing unit and the second resistance providing unit reduce the pull-up termination impedance value and the pull-down termination impedance value, respectively, when the target impedance value is less than a certain value, and have no influence on the pull-up termination impedance value and the pull-down termination impedance value, respectively, when the target impedance value is greater than the certain value.

13. The impedance adjusting device of claim 6, wherein the interface node is a node coupled to a data pad through which data is inputted/outputted.

14. An impedance adjusting device comprising:
- a calibration unit configured to generate an impedance code for adjusting a termination impedance value;
- a termination unit including transistors in parallel, each transistor configured to be selectively enabled by resistance selection information and terminate an interface node in response to the impedance code; and
- a resistance providing unit coupled in parallel to the termination unit and configured to provide a resistance in response to the resistance selection information and not in response to the impedance code,
- wherein the resistance providing unit is structurally different from the termination unit and is configured to be enabled in response to a comparison of a target impedance value to a reference impedance value.

15. The impedance adjusting device of claim 14, wherein the resistance providing unit comprises:
- a resistor;
- an AND gate configured to perform an AND operation on an enable signal and a portion of the resistance selection information; and
- a MOS transistor coupled between the resistor and the termination unit and configured to turn on/off in response to an output of the AND gate.

16. The impedance adjusting device of claim 1,
- wherein the resistance providing unit comprises a logic gate configured to receive an enable signal and the resistance selection information and a switching unit configured to turn on/off in response to an output of the logic gate, and
- wherein the termination units each comprise a logic gate configured to receive the enable signal and the resistance selection information, a first switching unit configured to turn on/off in response to an output of the respective logic gate, and a second switching unit coupled between the first switching unit and the interface node and configured to turn on/off in response to the impedance code.

17. The impedance adjusting device of claim 16,
- wherein the logic gate of the resistance providing unit and the logic gates of the termination units are AND gates.

18. The impedance adjusting device of claim 6,
- wherein the first resistance providing unit comprises a logic gate configured to receive an enable signal and the resistance selection information and a switching unit configured to turn on/off in response to an output of the logic gate, and
- wherein the pull-up termination units each comprise a logic gate configured to receive the enable signal and the resistance selection information, a first switching unit configured to turn on/off in response to an output of the respective logic gate, and a second switching unit coupled between the first switching unit and the interface node and configured to turn on/off in response to the pull-up code.

19. The impedance adjusting device of claim 14,
- wherein the resistance providing unit comprises a logic gate configured to receive an enable signal and the resistance selection information and a switching unit configured to turn on/off in response to an output of the logic gate, and
- wherein the termination unit comprises additional transistors coupled between the parallel transistors and the interface node, respectively, and a logic gate configured to receive the enable signal and the resistance selection information and provide an output signal to gates of the parallel transistors and the additional transistors are each coupled to receive the impedance code.

* * * * *